United States Patent [19]

Tohyama

[11] Patent Number: 5,537,146
[45] Date of Patent: Jul. 16, 1996

[54] SOLID STATE IMAGING DEVICE HAVING A PLURALITY OF SIGNAL LINES FOR SHIFT-REGISTER SECTION EXTENDING OVER PHOTOELECTRIC CONVERSION SECTION

[75] Inventor: Shigeru Tohyama, Tokyo, Japan

[73] Assignee: NEC Corporation, Tokyo, Japan

[21] Appl. No.: 359,862

[22] Filed: Dec. 20, 1994

Related U.S. Application Data

[63] Continuation of Ser. No. 962,148, Oct. 16, 1992, abandoned.

[30] Foreign Application Priority Data

Oct. 21, 1991 [JP] Japan ................................. 3-271616

[51] Int. Cl.[6] ....................................................... H04N 3/14
[52] U.S. Cl. ............................. 348/311; 348/315; 257/288
[58] Field of Search .................................... 348/322, 315, 348/311, 294; 257/228, 232, 220

[56] References Cited

U.S. PATENT DOCUMENTS

| | | | |
|---|---|---|---|
| 4,176,369 | 11/1979 | Nelson et al. | 357/24 |
| 4,197,553 | 4/1980 | Finnila et al. | 357/40 |
| 4,198,646 | 4/1980 | Alexander et al. | 357/30 |
| 4,213,137 | 7/1980 | Pines | 357/30 |
| 4,422,091 | 12/1983 | Liu | 357/24 |
| 4,507,674 | 3/1985 | Gaalema | 357/30 |
| 4,656,519 | 4/1987 | Savoye | 257/228 |
| 4,727,406 | 2/1988 | Rode | 357/30 |
| 4,774,557 | 9/1988 | Kosonocky | 257/228 |
| 5,001,530 | 3/1991 | Kurianski et al. | 357/24 |
| 5,122,669 | 6/1992 | Herring et al. | 250/370.14 |

*Primary Examiner*—Wendy R. Greening
*Attorney, Agent, or Firm*—Ostrolenk, Faber, Gerb & Soffen

[57] ABSTRACT

An inter-line, back-illuminated, solid state imaging device having a large active area. Metal signal lines providing driving signals to gate electrodes of vertical CCD shift-registers are disposed in front of radiation sensors. The metal signal lines can serve as metal mirrors for increasing the amount of usable radiation. At the gap portion of the metal signal lines, a second metal mirror can be provided. Alternatively, the dimension of the gap is smaller than the lowest wavelength of the band wavelength of the radiation to be detected. When a metal mirror is provided separately form the metal signal line group, the metal mirror can serve as a shield of the photoelectric conversion layer from the driving signal.

7 Claims, 6 Drawing Sheets

SOLID STATE IMAGING DEVICE HAVING A PLURALITY OF SIGNAL LINES FOR SHIFT-REGISTER SECTION EXTENDING OVER PHOTOELECTRIC CONVERSION SECTION

This is a continuation of application Ser. No. 07/962,148, filed Oct. 16, 1992, now abandoned.

BACKGROUND OF THE INVENTION

1. Field of the Invention

The present invention relates to a two-dimensional shift-register imaging device, and more particularly to an infrared-ray solid state imaging device for converting a two-dimensional image information to a time series electric signal and also to a method for manufacturing the same.

2. Discussion of the Related Art

Figure 1:
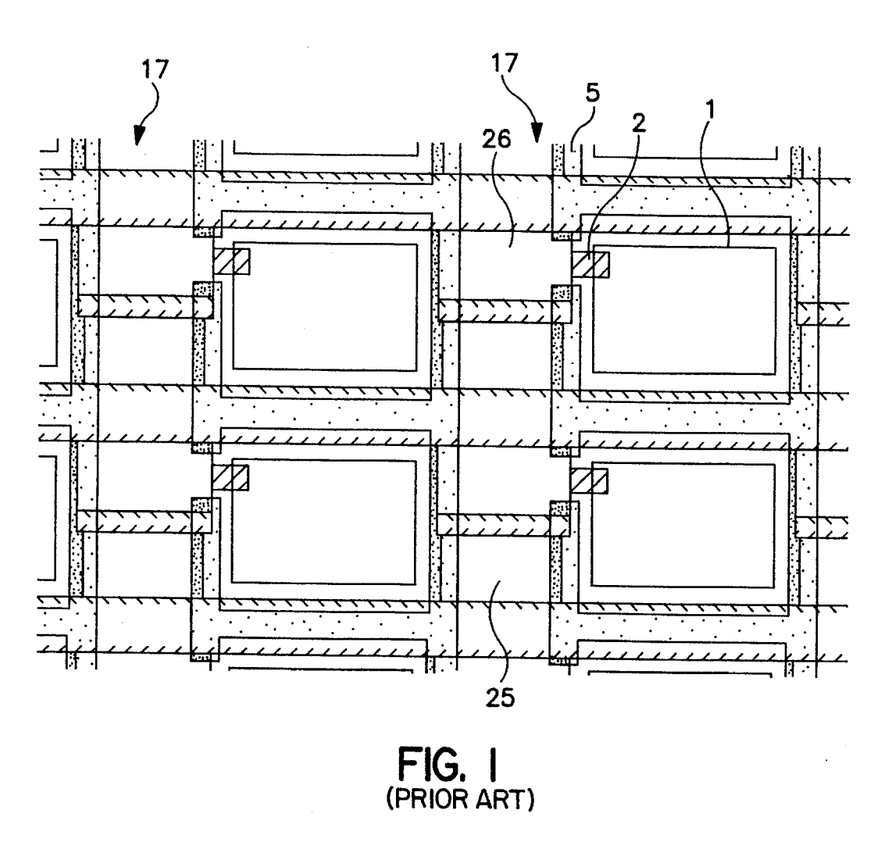
FIG. 1 is top plan view of a portion of a conventional infrared-ray solid state imaging device.

A conventional infrared-ray solid state imaging device will be first described with reference to FIG. 1, which shows a layout of 2×2 imager pixels on a semiconductor substrate. Each pixel has a radiation sensor having a photo-electric conversion layer 1 which accumulates signal charge during an optical integration period. The area for a radiation sensor is called an active area. Each column of the pixels is provided with a vertical CCD (charge coupled device) shift-register 17. The signal charge accumulated by the radiation sensor is transferred to the vertical CCD shift-register 17 through the respective source region 2 of the pixel at the end of the optical integration period.

Each vertical CCD shift-register 17 has a plurality of gate electrodes 25 and 26 provided with, for example, a four phase driving signal by signal lines 25, 26 of polycrystalline silicon layer. Since the photoelectric conversion layers 1 are composed of, for example, a PtSi layer and will be damaged by a high temperature thermal treatment, it is formed after the vertical CCD shift-register 17 and the signal lines 25, 26 are formed and subjected to thermal treatments. Hence, the signal lines 25, 26 are disposed outside the active area.

The signal charges are driven within the vertical CCD shift-registers 17 by the signal lines 25 and 26 in sequence in one direction, for example, downward in the drawing. Then, the signal charges are transferred to a horizontal CCD shift-register (not shown) at the end of each vertical CCD shift-register 17, and then outputted at an end of the horizontal CCD shift-register as a time series signal representing a two dimensional image signal.

A large capacitance is formed between each of the gate electrodes of the vertical CCD shift-registers 17 and the semiconductor substrate, so that each of the signal lines for transmitting the driving signals is required to have a small resistance for enabling a normal transmission of the signal charges through a rapid transmission and avoidance of a wave distortion of the driving signals. To reduce the resistance of the signal lines usually requires a large area for the signal lines.

It is especially required for an infrared-ray solid state imaging device to have a large ratio of the active area to the pixel area including the active area and the inactive area which includes the area for a respective part of the vertical CCD shift-registers 17 and for the signal lines 25, 26. With the conventional infrared-ray solid state imaging device, however, it is difficult to employ a large ratio of the active area to the pixel area due to the large area for the signal lines. It is noted that the above-mentioned conventional structure is applicable to sense a visible image and convert it into electrical information.

SUMMARY OF THE INVENTION

A major object of the present invention is to provide a two-dimensional solid state imaging device which has a large ratio of an active area to a pixel area, i.e. fill factor.

Another object of the present invention is to provide an infrared-ray solid state imaging device in which normal transmission of the signal charges is exactly carried out through a rapid transmission of the driving signals with exact waveforms.

According to the present invention, there is provided a two-dimensional solid state imaging device in which metal signal lines for providing driving signals to gate electrodes of CCD shift-registers are disposed above image sensors, with at least an insulation layer disposed between the signal lines and the radiation sensors.

With the two-dimensional solid state imaging device according to the present invention, the main portion of the metal signal lines for driving vertical CCD shift-registers are disposed on the active image sensor areas, so that a large width of the signal lines may be employed, resulting in a high fill factor. Since the signal lines for driving vertical CCD shift-registers are formed of metal which does not require a high temperature thermal treatment, the photoelectric conversion layer will not be damaged by forming the signal lines.

A metal mirror may preferably be formed on an active image sensor area between the metal signal lines for driving vertical CCD shift-registers for reflecting radiation passing through the active image sensor areas and re-irradiating back to the active image sensor areas for increasing the amount of usable signal radiation. The metal mirrors may serve as a shield for the photo-electric conversion layer and guard ring from the driving signal which may cause disturbing noise to the active image sensor areas. It also operates as another shield for shielding the metal signal lines from leaking the driving signal to another metal signal line. In these cases, the metal mirrors are maintained at a suitable constant potential.

Alternatively, the metal signal line per se may serve as metal mirrors for simplification of the construction and the process in manufacturing. In this case, the metal signal lines on an active image sensor area are formed with a gap of less than a lowest wavelength of radiation to be detected. According to such a configuration, the gap does not function as a gap effecting a leakage of the radiation to be detected.

The method for manufacturing the two-dimensional solid state imaging device having the second metal mirrors includes: forming photoelectric conversion layers disposed two-dimensionally on a substrate; depositing a first insulation film on areas each including the photoelectric conversion layer; depositing a first metal film on the first insulation film; forming metal signal line groups serving as wirings for driving vertical CCD shift-registers and as first metal mirrors; depositing a second insulation film in a second thickness on the metal signal line group and the first insulation film, the first thickness and the second thickness being of dimensions optically equal to each other; and then depositing a second metal film serving as at least a second metal mirror.

BRIEF DESCRIPTION OF THE DRAWINGS

Other and further objects, features and advantages of the present invention will be more apparent from the following description, referring to the accompanying drawings in which.

DETAILED DESCRIPTION OF THE PREFERRED EMBODIMENTS

Figure 2:
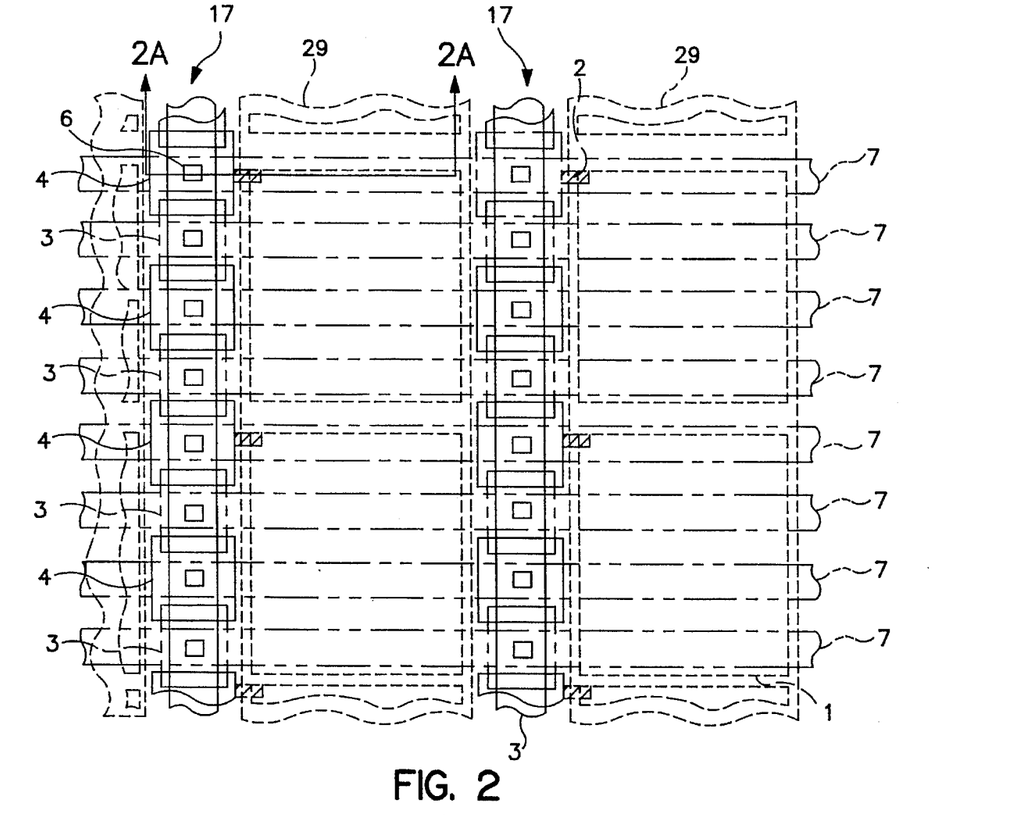
FIG. 2 is a top plan view of a portion of an infrared-ray solid state imaging device according to a first embodiment of the present invention.
Figure 2A:
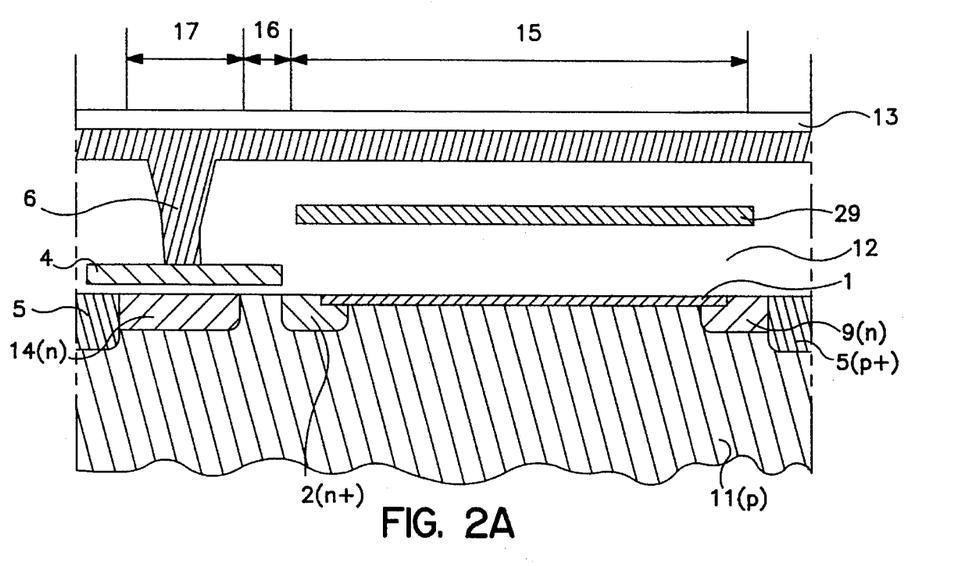
FIG. 2A is a sectional view of the embodiment of FIG. 2, taken on a line 2A—2A in FIG. 2.

Referring now to the drawings, FIG. 2 shows a layout of 2×2 pixels of an infrared-ray solid state imaging device of a back-illuminated type according to a first embodiment of the present invention. FIG. 2A shows a section of the first embodiment of FIG. 2, taken on a line 2A—2A in FIG. 2.

The imaging device shown is of the back-illuminated type. The infrared-ray is introduced to a back side of a p-type Si substrate. The infrared-ray solid state imaging device has a plurality of pixels arranged in two dimensions, i.e. a column direction and a row direction, on a front side of the p-type Si substrate 11. Each pixel has an infrared-ray image sensor 15 having a photoelectric conversion layer 1 constituting a photodiode in combination with the p-type substrate 11. Each photoelectric conversion layer 1 is encircled on four sides by an n-type guard ring 9 which overlaps in a part thereof a more heavily doped n⁺ source region 2. Two adjacent pixels are separated by an element separating region 5.

Each column of the pixels is provided with a vertical CCD shift-register 17, which has a channel 14 extending in the direction of the column and a plurality of gate electrodes 3 and 4 above the channel 14. The channel 14 is located at some distance from the source regions 2 of the corresponding pixels. Each portion of the vertical CCD shift-register 17 for a pixel is provided with four gate electrodes 3 and 4 which are connected through contacts 6 to respective metal signal lines 7 passing over the infrared sensor 15 as well as the gate electrodes 3 and 4. Each adjacent gate electrodes 3 and 4 are overlapped by each other at both end portions, with an insulation film disposed therebetween. Further, a side portion 16 of each of the gate electrodes 3 and 4 serves as a transfer gate for reading out a signal charge from the photoelectric conversion layer 1 through the source region 2 to the channel 14.

Four signal lines 7 of constituting a metal signal lines which is made of aluminum (AL), Tungsten (W) or the like, are arranged in parallel to each other above a row of the photoelectric conversion layers 1. A metal mirror 29 of Al, W or the like is provided between metal signal lines 7 and photoelectric conversion layer 1. Metal mirror 29 serves as a layer for shielding the photo-electric conversion layer 1 and guard ring 9 from the noise of the driving signal on the metal signal lines 7 and for shielding the driving signal on a metal signal line from being deformed by that on adjacent metal signal lines. A passivation layer 13 covers the whole surface of the infrared-ray solid state imaging device.

The thickness t of the insulation layer 12 between the metal mirror 29 and the photoelectric conversion layer 1 is determined as $t = k \cdot \lambda o / 4n$ wherein $\lambda o$, $n$, and $k$ are a center wavelength of the band wavelength of infrared radiation for the infrared sensor, the refractive index of the insulation layer, and a small positive odd number, respectively. For example, if it is assumed that the band wavelength is 3 to 5 μm, i.e. $\lambda o = 4$ μm, and that $n = 1.45$ and $k = 1$, then t is calculated as 6897 angstroms, Hence, t is determined as 7000 angstrom. That is, if an insulation film of $SiO_2$ with a 1.45 refractive index is to be deposited on a photoelectric conversion layer, the insulation film 12 is deposited in a thickness of 7000 angstroms. The bifunctional metal mirror and shield is deposited on the insulation film 12 of $SiO_2$ and then it is applied with a certain potential, i.e. a potential at the substrate 11, for example, for electrostatic-shielding of the photoelectric conversion layer 1 and the guard ring 9 from the driving signal and for electrically shielding a metal signal line 7 from adjacent metal signal lines. The metal mirror 29 is provided with a terminal (not shown) for this purpose.

With the embodiment described above, the operation is as follows: The infrared-ray sensors 15 each accumulates negative signal charges at the photoelectric conversion layer 1 during an optical integration period. At the end of the optical integration period, selected ones of the gate electrodes 4 are applied with a high voltage, so that the signal charges as accumulated in the infrared sensors 15 are read out from the photoelectric conversion layers 1 in all the columns to the respective vertical CCD shift-registers 17. Then the signal charges are transferred within the channel 14 by the gate electrodes 3 and 4 periodically driven by a four phase driving signal.

The signal charges are transferred to a horizontal CCD shift-register (not shown) at the end of each vertical CCD shift-register 17, and then outputted from the horizontal CCD shift-register at an end thereof as a time series signal representing a two-dimensional image signal.

The metal signal line group runs over a row of the photoelectric conversion layer 1, so that the area inactive to infrared radiation in a pixel can be limited to the extent of a sum of the vertical CCD shift-registers 17 and the channel-stopper regions 5, so that a large fill factor can be designed.

Figure 3:
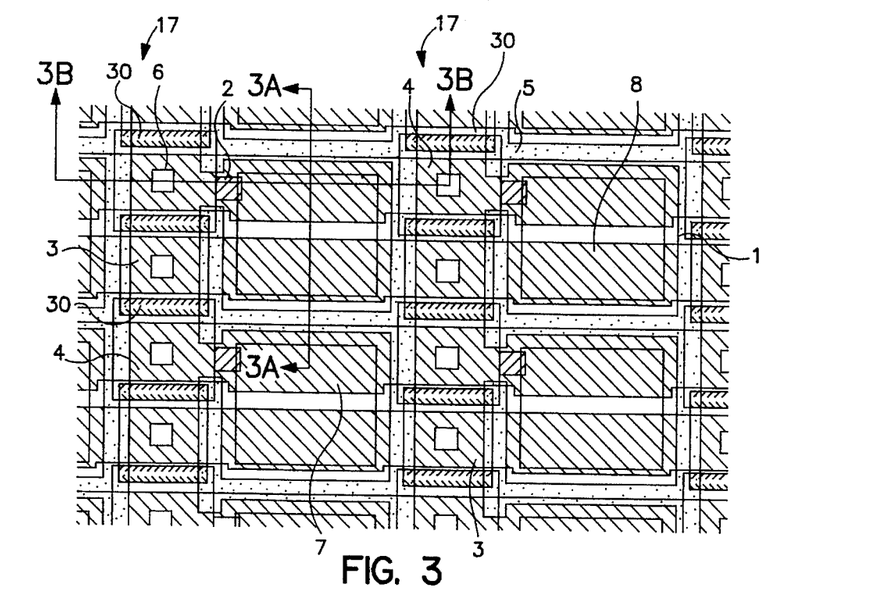
FIG. 3 is a top plan view of a portion of an infrared-ray solid state imaging device according to a second embodiment of the present invention.
Figure 3A:
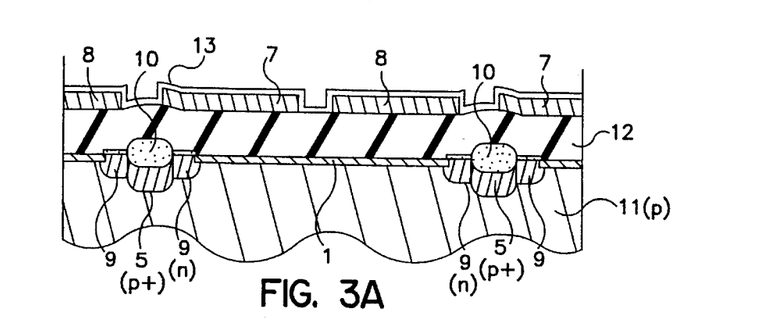
FIG. 3A is a sectional view of the embodiment of FIG. 3, taken on a line 3A—3A in FIG. 3.
Figure 3B:
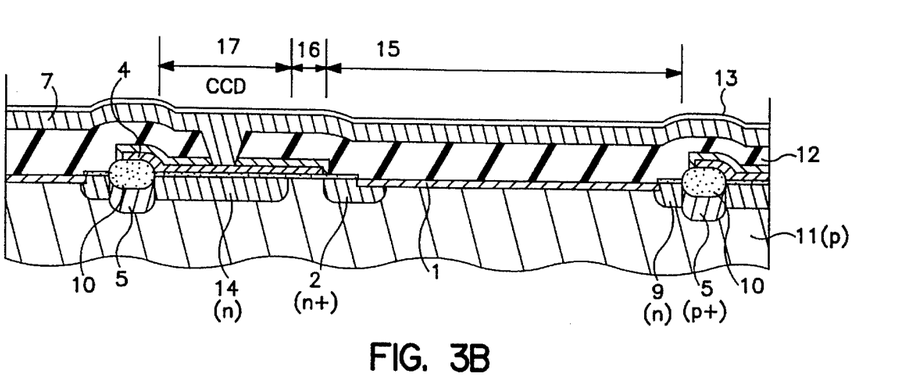
FIG. 3B is a sectional view of the embodiment of FIG. 3, taken on a line 3B—3B in FIG. 3.

FIG. 3 shows a layout of 2×2 pixels of an infrared-ray solid state imaging device of a back-illuminated type according to a second embodiment of the present invention. FIGS. 3A and 3B each shows a section of the second embodiment of FIG. 3, FIGS. 3A and 3B being taken on a line 3A—3A and on a line 3B—B in FIG. 3, respectively.

In those drawings, the infrared-ray solid state imaging device has a plurality of imager pixels arranged in two dimensions on a p-type Si substrate 11. Each pixel has an infrared-ray image sensor 15 having a photoelectric conversion layer 1 constituting a photodiode in combination with the p-type substrate 11. Each photoelectric conversion layer 1 is encircled on four sides by an n-type guard ring 9 which overlaps in a part thereof a more heavily doped $n^+$ source region 2. Two adjacent pixels are separated by a channel-stopper region 5 and a thick oxide film 10.

Each column of the pixels is provided with a vertical CCD shift-register 17, which has a channel 14 extending in the direction of the column and a plurality of gate electrodes 3 and 4 above the channel 14. The channel 14 is located at some distance from the source regions 2 of the corresponding pixels. Gate electrodes 3 are connected through contacts 6 to metal signal lines 8, which are shadowed in FIG. 3 and pass over the sensor 15 as well as the gate electrodes 3, while gate electrodes 4 are connected through contacts 6 to metal signal lines 7, which are shadowed-in FIG. 3 and pass over the sensor 15 as well as the gate electrodes 4. Each two adjacent gate electrodes and 4 are overlapped by each other at both end portions 30 of the gate electrodes 3 and 4, with an insulation film disposed therebetween. Further, a side portion 16 of each of the electrodes 3 and 4 serves as a transfer gate for reading out a signal charge from the photoelectric conversion layer 1 through the source region 2 to the channel 14.

As shown in FIGS. 3A and 3B, a pair of metal signal lines 7 and 8 are arranged in parallel to each other above a row of the photoelectric conversion layers 1 of the active image sensor area. A passivation layer 13 covers the whole surface of the infrared-ray solid state imaging device.

With the embodiment described above, the operation is as follows: The infrared-ray sensors 15 each accumulates negative signal charges at the photoelectric conversion layer 1 during an optical integration period. At the end of the optical integration period, the gate electrodes 4 is applied with a high voltage, so that the signal charges as accumulated in every other infrared sensor 15 in every column are read out through the source region 2 to the channel 14 of the respective vertical CCD shift-registers 17. Then the signal charges are transferred within the channel 14 by the gate electrodes 3 and 4 periodically driven by a four phase driving signal.

The signal charges are transferred to a horizontal CCD shift-register (not shown) at the end of each vertical CCD shift-register 17, and then outputted from the horizontal CCD shift-register at an end thereof as a time series signal representing one of the two fields of a two dimensional image signal.

At the end of the subsequent optical integration period, the gate electrodes not applied by a high voltage at the end of the previous optical integration period are now applied with a high voltage. The signal charges accumulated in the other half of the sensors are outputted from the respective photoelectric conversion layers 1 through the vertical and horizontal CCD shift-registers in a similar way as described above. The output of the horizontal CCD shift-register is another time series signal representing the other of the two fields of the two dimensional image signal. The two fields are combined by interlacing on a display panel for outputting the image information from the infrared radiation.

The metal signal line group runs over a row of the photoelectric conversion layer 1 and functions as infrared-ray reflecting metal mirrors. Hence, the area inactive to infrared radiation in a pixel can be limited to the extent of a sum of the vertical CCD shift-registers 17 and the channel-stopper regions 5, so that a large fill factor can be designed.

With the embodiment described above, a metal signal line group is composed of a pair of lines per a row of the pixels, and the signal charges are read out from every other pixel in a column. However, it is only an exemplary construction and such a construction is also possible in which a vertical CCD shift-register 17 reads out from every pixel in a column at the end of one optical integration period. In this case, a metal signal line group is composed of three or more metal signal lines per a row of the pixels, accordingly. Such is the case also with other embodiments described hereinafter.

Figure 4:
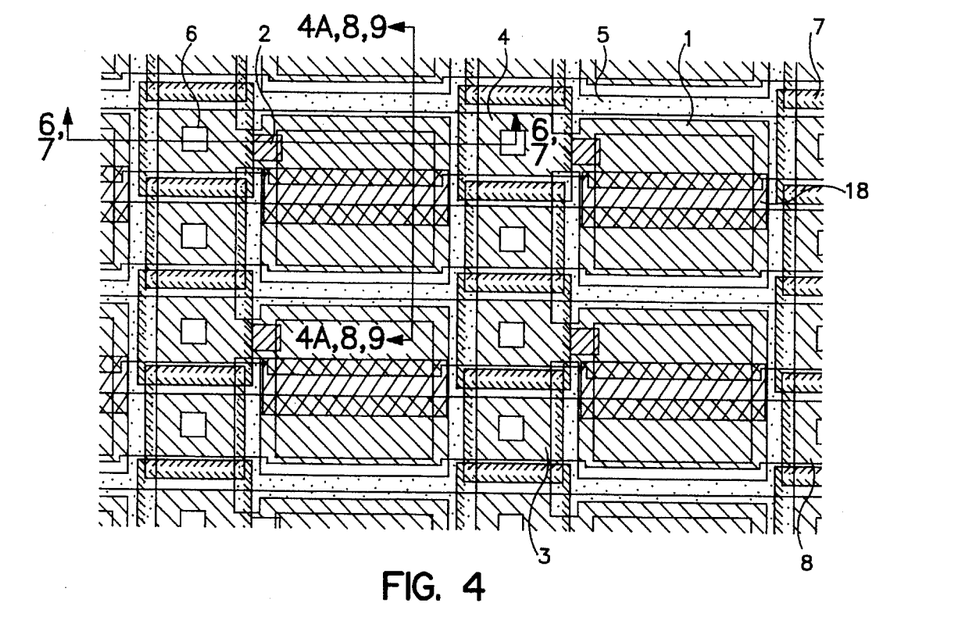
FIG. 4 is a top plan view of a portion of an infrared-ray solid state imaging device according to a third embodiment of the present invention.
Figure 4A:
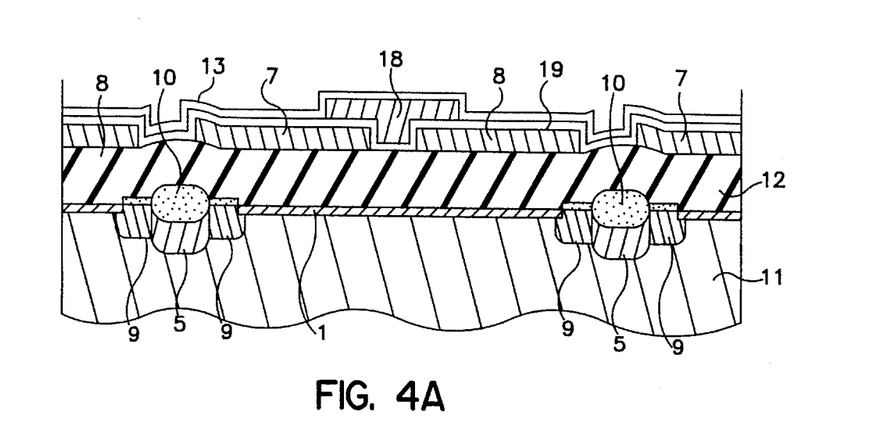
FIG. 4A is a sectional view of the embodiment of FIG. 4, taken on a line 4A—4A in FIG. 4.

FIG. 4 shows a layout of 2×2 pixels in a third embodiment according to the present invention and FIG. 4A shows a sectional view taken on a line 4A—4A in FIG. 4. With this embodiment, a second metal mirror 18 is additionally provided to the embodiment shown in FIGS. 3 and 3A at a gap portion of a metal signal line group having two metal signal lines 7 and 8. The second metal mirror 18 is separated by an interlayer insulation film 19 from the metal signal line group having signal lines 7 and 8. Since the other configurations in FIG. 4 and 4A are similar to those in FIGS. 3 and 3A, further description is not made here for avoiding a duplication.

With the infrared-ray solid state imaging device according to the third embodiment, leakage of the infrared radiation from the gap portion of the metal signal lines 7 and 8 can be avoided by the function of the second metal mirror 18, so that the amount of the usable infrared radiation is not less than that in a conventional infrared-ray solid state imaging device having a one-piece metal mirror in a pixel area.

In FIGS. 4 and 4A, the second metal mirror 18 is disposed at the gap portion only. However, it can be formed as a more uniform metal layer covering the whole surface or at least each active area of the imaging device.

Figure 5:
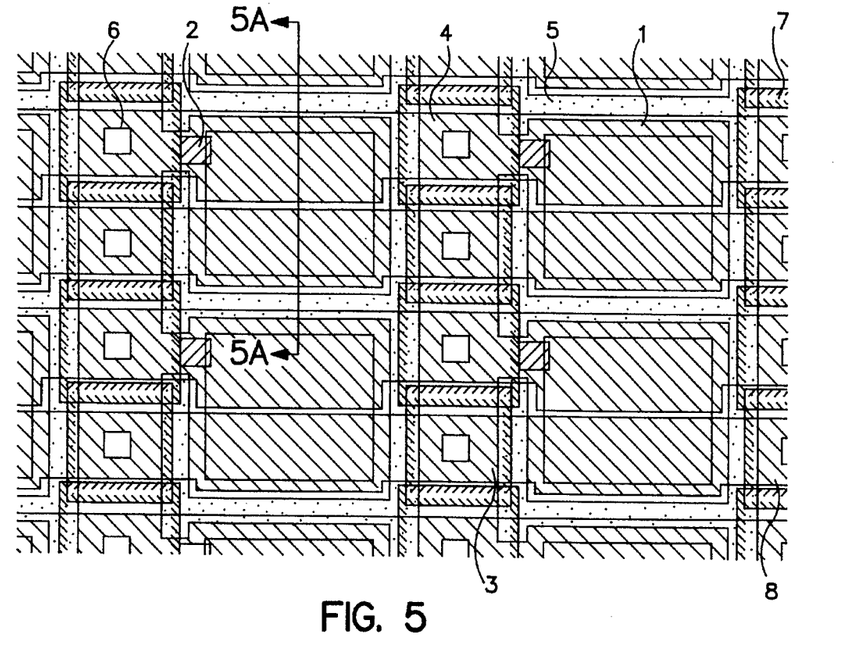
FIG. 5 is a top plan view of a portion of an infrared-ray solid state imaging device according to a fourth embodiment of the present invention.
Figure 5A:
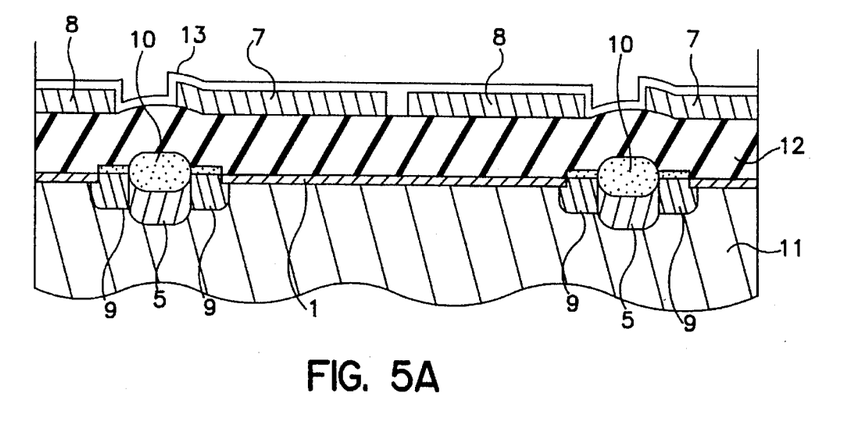
FIG. 5A is a sectional view of the embodiment of FIG. 5, taken on a line 5A—5A in FIG. 5.

FIGS. 5 and 5A each shows a fourth embodiment according to the present invention similarly to FIGS. 4 and 4A, respectively. In the fourth embodiment, a gap portion 20 of a metal signal line group having signal lines 7 and 8 is constructed in a dimension less than the lowest wavelength of a band wavelength for the infrared sensor, i.e. a band wavelength to be used in the infrared-ray solid state imaging device. For example, in case of a typical band wavelength of 3 to 5 μm for an infrared sensor, the dimension of the gap of the metal signal lines 7 and 8 is formed less than 3 μm. When such a construction is employed, the gap portion scarcely functions as a leakage gap for an infrared radiation due to the optical fluctuation of the infrared radiation, so that the leakage of the infrared radiation is reduced to a minimum even without a second metal mirror 18 as shown in FIG. 4A.

Figure 6:
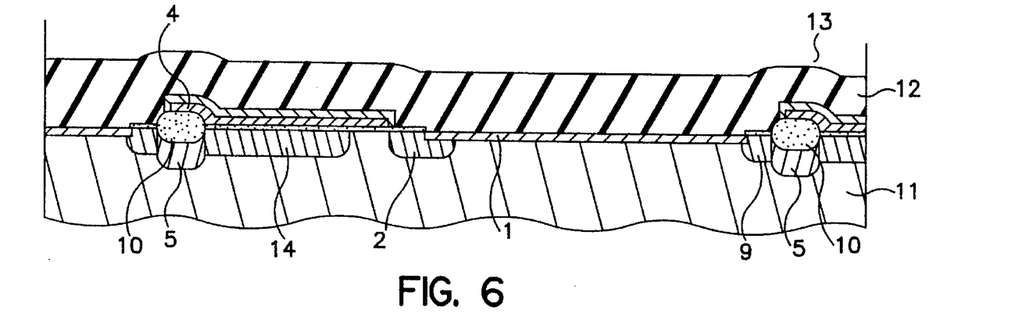
FIG. 6 is a sectional view of the infrared-ray solid state imaging device of FIG. 4 during a fabricating process for explaining a method according to an embodiment, taken on a line 6—6 in FIG. 4.

FIGS. 6 to 9 are sectional views for showing a method according to an embodiment for manufacturing the infrared-ray solid state imaging device of FIGS. 4 and 4A. FIG. 6 shows a step in which a photoelectric conversion layer 1, element separating regions 5, vertical CCD shift-registers etc. are formed and an insulation film 12 is deposited thereon.

Figure 7:
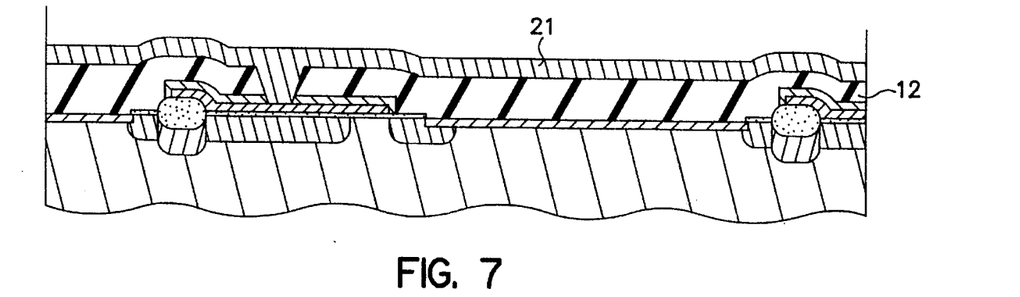
FIG. 7 is a sectional view of the infrared-ray solid state imaging device of FIG. 4 during a fabricating process for explaining a method according to an embodiment, taken on a line 7—7 in FIG. 4.
Figure 8:
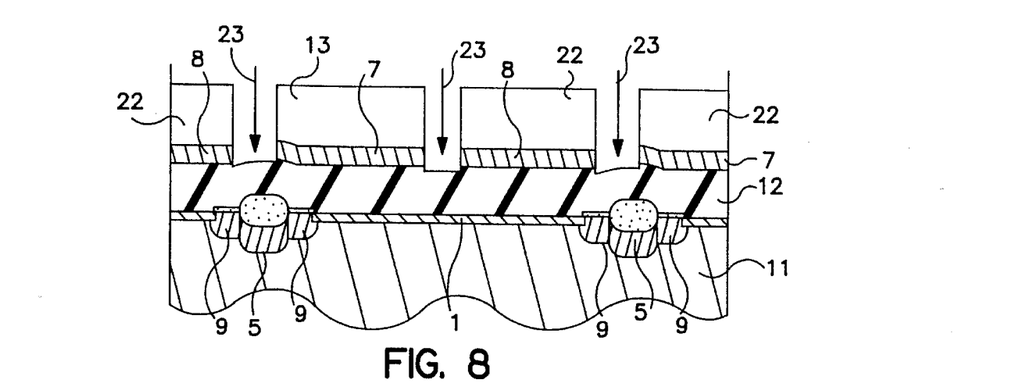
FIG. 8 is a sectional view of the infrared-ray solid state imaging device of FIG. 4 during a fabricating process for explaining a method according to an embodiment, taken on a line 8—8 in FIG. 4.
Figure 9:
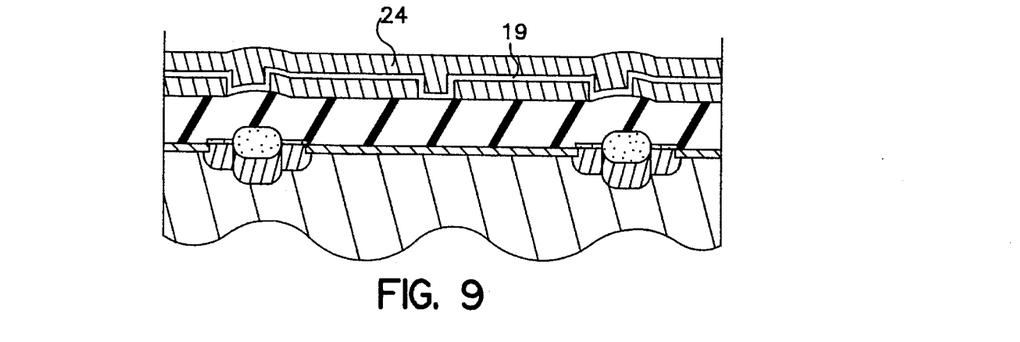
FIG. 9 is a sectional view of the infrared-ray solid state imaging device of FIG. 4 during a fabricating process for explaining a method according to an embodiment, taken on a line 9—9 in FIG. 4.

After contact holes are formed in the insulation film 12 and a few subsequent steps such as forming barrier metals are finished, a metal film 21 is deposited for forming a metal signal line group (FIG. 7). Then, the metal film 21 is patterned by dry-etching using plasma bombardment 23, following which the underlying insulation film 12 is over-etched (FIG. 8). Next, an interlayer insulation film 19 is formed in a thickness t" which is optically equivalent to the amount (thickness) of the over-etching of the underlying insulation film 12, as described later. A metal film 24 for forming second metal mirrors is deposited thereon (FIG. 9). After subsequent patterning of the metal film 24, forming passivation film etc., an infrared-ray solid state imaging device will be accomplished as shown in FIG. 4A.

The thickness t of the underlying insulation film 12 is approximately expressed as $t=k \cdot \lambda o/4n$, wherein k is a small positive odd number, $\lambda o$ is the center wavelength of the band wavelength of the infrared radiation in use and n is the refractive index of the underlying insulation film 12. With this configuration, the infrared radiation which is reflected by the first metal mirror as patterned from the metal film 21 and then absorbed by the photoelectric conversion film 1 is matched in phase with the infrared radiation which is absorbed directly from the substrate by the photoelectric conversion film 1.

The thickness t" of the interlayer insulation film 19 is approximately expressed as $t"=nt'/n"$ wherein t' is the thickness of the over-etching of the underlying insulation film 12 and n" is the refractive index of the interlayer insulation film 19. With this configuration, both the surfaces of the metal signal line group 7 and 8 and second metal mirror 24 at the side near the photoelectric conversion layer 1 are disposed at the distances optically equal to each other from the photoelectric conversion layer 1. As a result, infrared radiations reflected by the first mirror 7 and 8 and the second mirror 24 are matched together in phase at the photoelectric conversion layer 1.

As described above, according to the solid-state imaging device of the embodiments of the present invention, since the metal signal lines which require a large area for a rapid transmission of a driving signal can be disposed on the active image sensor areas, the fill factor of the imaging device can be large.

When the metal signal lines function as metal mirrors for reflecting radiations to be detected, such as infrared radiations, the construction and the steps for manufacturing the solid state imaging device can be very simplified. Alternatively, since metal mirrors disposed between the metal signal lines and the photoelectric conversion layer serves as shields for the active image sensor areas including the photoelectric conversion layer and the guard ring, a noise-free output signal can be obtained. Further, since the metal signal lines are shielded from adjacent metal signal lines, the driving signal is prevented from being deformed to ensure the quick and exact transmission of the signal charges.

Further, with the method according to the embodiment of the present invention, the optical effect of a metal signal line group and a second metal reflecting mirror can be optimized for reproducing precise optical signal information.

Since the above embodiments are described only as examples, the present invention is not limited to such embodiments and it will be obvious for those skilled in the art that various modifications or alterations can be easily made based on the above embodiments within the scope of the present invention.

What is claimed is:
1. A solid-state imaging device comprising:
a semiconductor substrate having a back side for receiving radiation and a front side opposite to said back side;
a radiation sensor section formed on said front side, said radiation sensor section including a plurality of photoelectric conversion regions arranged to accumulate signal charges generated by radiation;
a shift-register section formed on said front side adjacent and parallel to said radiation sensor section and including a channel formed in said front side of said substrate for receiving said signal charges from said photoelectric conversion regions of said radiation sensor section and for shifting said signal charges through said shift-register section;
an insulating layer formed on said front side to cover said radiation sensor section and said shift-register section, said insulating layer having a plurality of contact holes formed therein;
a plurality of transfer gates formed in said insulating layer for transferring said signal charges accumulated by said photoelectric conversion regions to said shift-register section;
a plurality of gate electrodes formed in said insulating layer, a selected one of said gate electrodes being arranged adjacent to each of said transfer gates for controlling said transferring of said signal charges from said photoelectric conversion regions to said shift-register section; and
a plurality of signal lines formed on said insulating layer, extending in front of and isolated from said photoelectric conversion regions, each of said signal lines being connected to an associated one of said gate electrodes through an associated one of said contact holes.

2. The imaging device as claimed in claim 1, wherein said gate electrodes are larger in number than said photoelectric conversion regions so that a plurality of said signal lines cross over each of said photoelectric conversion regions in parallel to each other.

3. The imaging device as claimed in claim 2, further comprising a first metal mirror disposed in front of said radiation sensor section, said first metal mirror being supplied to shield said radiation sensor section.

4. The imaging device as claimed in claim 3, further comprising:
a radiation sensor formation portion formed on said front side of said semiconductor substrate and divided into a plurality of first parts arranged in parallel to one another, each having at least one of said radiation sensor sections formed therein; and
a shift-register formation portion formed on said front side of said semiconductor substrate and divided into a plurality of second parts each disposed between adjacent ones of said first parts and having at least one of said shift-register sections formed therein.

5. The imaging device as claimed in claim 3, wherein said signal lines extending in front of said radiation sensor section serve as said first metal mirror.

6. A solid-state imaging device as defined in claim 5 further comprising a second metal mirror disposed at least at a gap portion between adjacent ones of said signal lines above said radiation sensor, with an insulation film disposed between said second metal mirrors and adjacent ones of said signal lines.

7. A solid-state imaging device as defined in claim 5 wherein said signal lines are so disposed that a dimension of a gap between two adjacent said ones of said signal lines disposed above said radiation sensor is less than a lowest wavelength of band wavelength of radiation to be detected.

* * * * *